United States Patent [19]

Yoshida et al.

[11] Patent Number: 5,760,597

[45] Date of Patent: Jun. 2, 1998

[54] METHOD OF AND APPARATUS FOR MEASURING LIFETIME OF CARRIERS IN SEMICONDUCTOR SAMPLE

[75] Inventors: Naoyuki Yoshida; Hiroyuki Takamatsu; Shingo Sumie; Yutaka Kawata; Hidehisa Hashizume; Futoshi Ojima; Yuji Hirao, all of Kobe, Japan

[73] Assignees: Kabushiki Kaisha Kobe Seiko Sho, Kobe; Genesis Technology, Inc., Tokyo, both of Japan

[21] Appl. No.: 659,515

[22] Filed: Jun. 6, 1996

[30] Foreign Application Priority Data

Jun. 6, 1995 [JP] Japan .................. 7-139036

[51] Int. Cl.$^6$ .................................. G01R 31/26
[52] U.S. Cl. ............................. 324/765; 324/752
[58] Field of Search .......................... 324/752, 753, 324/754, 755, 756, 757, 758, 760, 761, 765, 767

[56] References Cited

U.S. PATENT DOCUMENTS

| | | | |
|---|---|---|---|
| 3,939,415 | 2/1976 | Terasawa | 324/767 |
| 4,704,576 | 11/1987 | Tributsch et al. | 324/751 |
| 5,047,713 | 9/1991 | Kirino et al. | 324/752 |
| 5,049,816 | 9/1991 | Moslehi | 324/767 |
| 5,196,786 | 3/1993 | Usami et al. | 324/765 |
| 5,406,214 | 4/1995 | Boda et al. | 324/765 |
| 5,430,386 | 7/1995 | Morin et al. | 324/765 |
| 5,438,276 | 8/1995 | Kawata et al. | 324/765 |

FOREIGN PATENT DOCUMENTS

| | | | |
|---|---|---|---|
| WO 94/14188 | 6/1994 | Hong Kong | H01L 21/306 |
| WO 94/14188 | 7/1994 | WIPO | |

OTHER PUBLICATIONS

Horanyi, T.S., Pavelka, T. and Tutto, P., "In situ bulk lifetime measurement on silicon with a chemically passivated surface," *Applied Surface Science*, vol. 63 (1993) pp. 306–311. Jul. 1992.

*Primary Examiner*—Ernest F. Karlsen
*Assistant Examiner*—Anh Phung
*Attorney, Agent, or Firm*—Hazel & Thomas, PC

[57] ABSTRACT

In addition to microwave and excitation light, bias light as well is irradiated upon a surface of a semiconductor sample that is passivated using a solution which contains an electrolyte. Irradiation of the bias light increases the quantity of ionic substances that exist in the solution, largely changes a surface potential of the semiconductor sample, and suppresses surface recombination. This makes it possible to measure the lifetime of carriers which exist within the semiconductor sample at a high accuracy, without influenced by surface recombination.

14 Claims, 9 Drawing Sheets

METHOD OF AND APPARATUS FOR MEASURING LIFETIME OF CARRIERS IN SEMICONDUCTOR SAMPLE

BACKGROUND OF THE INVENTION

1. Field of the Invention

The present invention relates to a method of and an apparatus for measuring the lifetime of carriers which exist within a semiconductor sample.

2. Description of the Prior Art

As a method of measuring a period of time since electrons and holes (hereinafter "carriers") are created within a semiconductor sample until the carriers disappear, i.e., the lifetime of the carriers, a photoconductive decay method has been in a wide use.

In the photoconductive decay method, microwave energy is irradiated upon a semiconductor sample while concurrently irradiating pulse laser light upon the semiconductor sample as excitation light. If a laser light source is selected so that the photon energy of the laser light to be irradiated is equal to or larger than the band gap of a semiconductor which forms the sample, irradiation of the laser light creates carriers in the sample. Due to defects, impurities, etc., in the crystal, the carriers which are created in this manner recombine with each other through energy levels which locally exist in the band gap, and the number of the carriers decreases gradually. During this process, the intensity of reflected or transmitted microwave from the semiconductor sample changes depending on the quantity of the carriers. Hence, the lifetime is calculated based on a change in the intensity of the reflected or transmitted microwave which is successively measured. That is, a time since the intensity of the reflected or transmitted microwave become greatest until it decreases to a certain level is calculated, and this period of time is regarded as a period of time during which the carriers can exist within the semiconductor sample, i.e., the lifetime.

In general, the lifetime which is calculated in this measurement method is expressed by the following equation:

$$1/\tau t = (1/\tau b + 1/\tau s)$$

where $\tau t$ is the lifetime which is obtained based on the measurement, $\tau b$ is the lifetime of the carriers which exist within the semiconductor sample, and $\tau s$ is the lifetime of the carriers which exist at surface regions of the semiconductor sample.

In general, more defects exist at surface regions of a semiconductor sample than within the sample, and a number of defects are created due to impurities which adhere to the surface of the sample. Hence, recombinations of carriers continually occur during a short period of time at the surface regions of the sample, and therefore, so-called surface recombination becomes dominant while carriers disappear. Hence, the lifetime $\tau t$ which is measured is almost the lifetime $\tau s$ of the carriers which exist at the surface regions of the semiconductor sample. This makes it difficult to measure the lifetime $\tau b$ that is to be originally measured of the carriers which exist within the semiconductor sample.

To deal with this, as a simple method of suppressing such surface recombination, a so-called chemical passivation method has been proposed which requires immersing a semiconductor sample into a solution which is obtained by solving iodine, for example, with an organic solvent and to measure the lifetime in this condition (In situ bulk lifetime measurement on silicon with a chemically passivated surface, T. S. Horani, etc. Applied Surface Science 63(1993) 306–311 North-Holland; Japanese Patent Examined Gazette No. 5-505881).

However, in the conventional method described above, surface recombination cannot be sufficiently suppressed and still many of the carriers which are created recombine with each other at the surface region. Due to this, when light is irradiated during measurement, it changes the surface energy condition, which in turn changes a lifetime value which is actually measured.

SUMMARY OF THE INVENTION

An object of the present invention is to provide for a method of and an apparatus for measuring the lifetime of carriers which exist within a semiconductor sample, with which it is possible to measure a lifetime within the semiconductor sample at a high degree of accuracy.

The present invention is related to a method of measuring the lifetime of carriers which exist within a semiconductor sample. This measurement method comprises the steps of: passivating a surface of a semiconductor sample, using a solution which contains an electrolyte; irradiating excitation light upon the passivated surface of the semiconductor sample while irradiating microwaves upon the passivated surface of the semiconductor sample; irradiating bias light upon the passivated surface of the semiconductor sample at least since before carriers are created in the semiconductor sample, due to the excitation light until the carriers disappear; and detecting transmitted or reflected microwaves from the semiconductor sample to measure the lifetime of carriers which are induced within the semiconductor sample, based on a change in the microwaves.

The present invention is related also to an apparatus for measuring the lifetime of carriers which exist within a semiconductor sample. The measurement apparatus comprises: sample surface processing means for passivating a surface of a semiconductor sample, using a solution which contains an electrolyte; microwaves irradiating means for irradiating microwave upon the passivated surface of the semiconductor sample; excitation light irradiating means for irradiating excitation light upon the surface of the semiconductor sample which is irradiated with the microwaves; bias light irradiating means for irradiating bias light upon the passivated surface of the semiconductor sample at least since before carriers are created in the semiconductor sample due to the excitation light until the carriers disappear; and lifetime measuring means for detecting transmitted or reflected microwaves from the semiconductor sample and for measuring the lifetime of carriers which are induced within the semiconductor sample, based on a change in the microwaves.

In the present invention, a surface of a semiconductor sample is passivated in advance, using a solution which contains an electrolyte, and excitation light is irradiated upon the passivated surface of the semiconductor sample while simultaneously irradiating microwaves upon the passivated surface of the semiconductor sample. Transmitted or reflected microwaves from the semiconductor sample is detected. Based on a change in the intensity of the transmitted or reflected microwaves, the lifetime of carriers which are induced within the semiconductor sample is measured. During the measurement, bias light is irradiated separately from the excitation light upon the passivated surface of the semiconductor sample.

It is possible to suppress surface recombination to a certain extent when the surface of the semiconductor sample is passivated in advance in this manner. Further, irradiation of the bias light increases the quantity of ionic substances which exist in the solution, largely changes a surface potential of the semiconductor sample, and further suppresses surface recombination. This makes it possible to measure the lifetime of carriers which exist within the semiconductor sample at a high accuracy; without being influenced by surface recombination.

These and other objects, features, aspects and advantages of the present invention will become more apparent from the following detailed description of the present invention when taken in conjunction with the accompanying drawings.

DESCRIPTION OF THE PREFERRED EMBODIMENTS OF THE INVENTION

In the following, preferred embodiments realizing the present invention will be described with reference to the attached drawings, for understanding of the present invention. It is to be noted, however, that the following preferred embodiments are merely examples for realizing the present invention but are not intended to limit the technical scope of the present invention.

Figure 1:
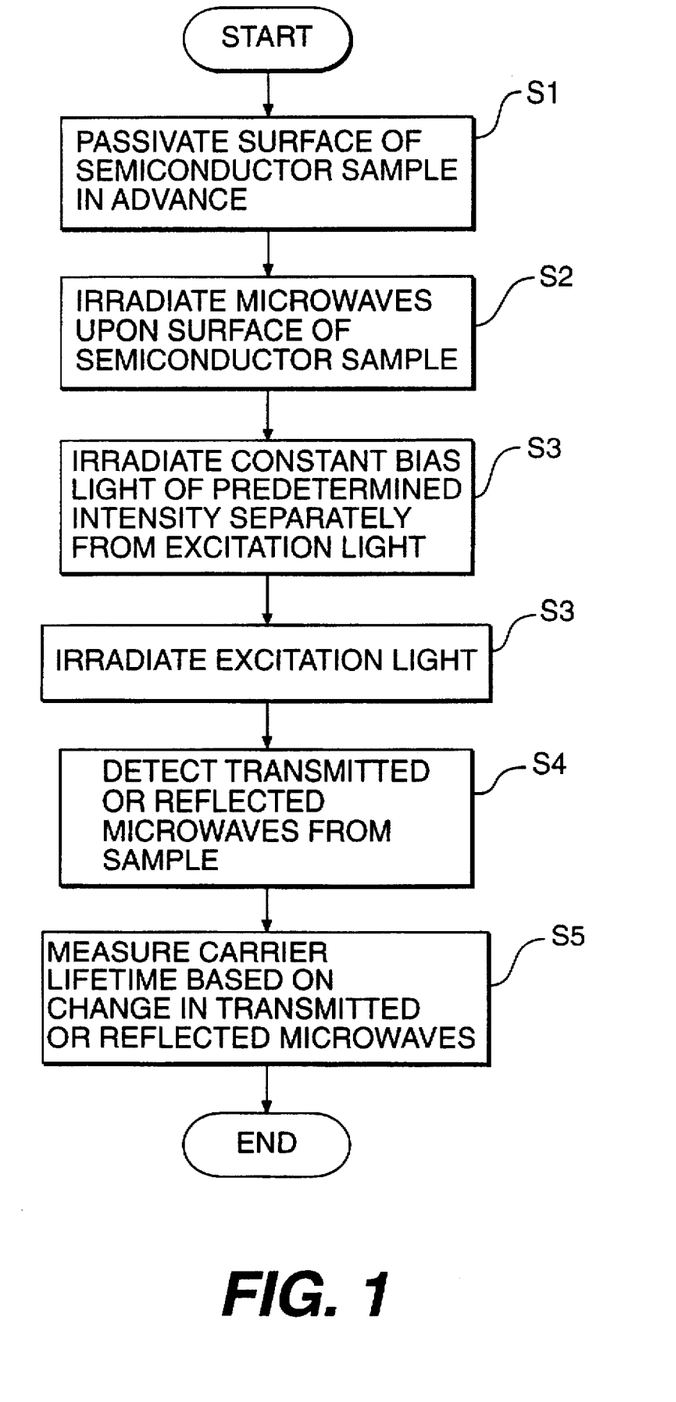
FIG. 1 is a flow chart showing a general construction of a method of measuring the lifetime of carriers which exist within a semiconductor sample according to a preferred embodiment of the present invention.

FIG. 1 is a flow chart showing the general construction of a method of measuring the lifetime of carriers which exist within a semiconductor sample according to a preferred embodiment of the present invention. The method of measuring the lifetime of carriers, which exist within a semiconductor sample according to this preferred embodiment, is the same as the conventional method in the following points, as shown in FIG. 1. First, a surface of a semiconductor sample is passivated, using a solution which contains an electrolyte (S1). Excitation light is irradiated upon the passivated surface of the semiconductor sample while irradiating microwaves upon the passivated surface of the semiconductor sample (S2, S3), transmitted microwave or reflected microwave from the semiconductor sample is detected (S4), and the lifetime of carriers which are induced within the semiconductor sample is measured based on a change in the intensity of the reflected or transmitted microwave (S5).

However, this preferred embodiment is different from the conventional method in requiring bias light to be irradiated separately from the excitation light upon the passivated surface of the semiconductor sample (S3').

Figure 2:
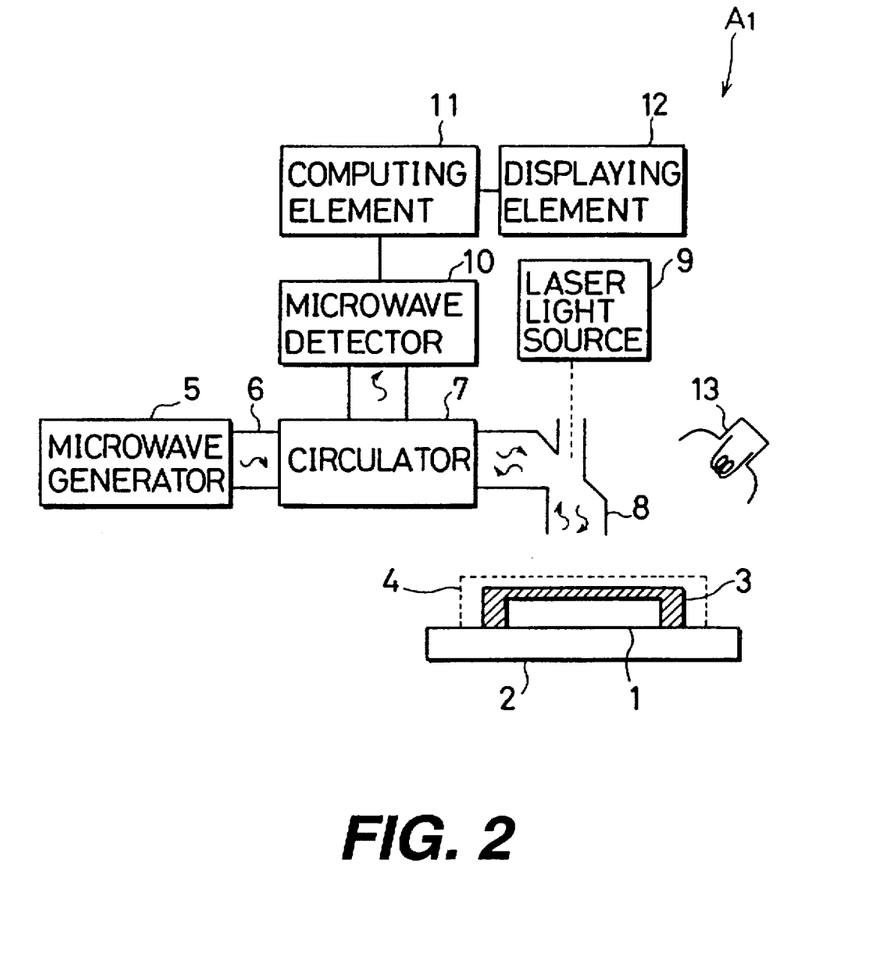
FIG. 2 is a diagram showing a measurement apparatus according to the preferred embodiment, to which the measurement method shown in FIG. 1 is applicable.

FIG. 2 is a diagram showing a measurement apparatus according to the preferred embodiment, to which the measurement method described above is applicable. As shown in FIG. 2, this apparatus A1 comprises sample surface processing means that is formed by a solution 3 and a solution cell 4 (which corresponds to an immersion bath). The sample surface processing means performs the step S1 of the method above. Microwave irradiating means is formed by a microwave generator 5, a waveguide 6, a circulator 7, and an antenna 8, to perform the step S2. Excitation light irradiating means is formed by a laser light source 9, to perform the step S3. Microwave detecting means is formed by a microwave detector 10, to perform the step S4. Lifetime measuring means is formed by a computing element 11 and a displaying element 12, to perform the step S5. Further, bias light irradiating means is formed by a halogen light source 13, to perform the step S3'.

Now, the method above will be described in more detail, sequentially from the steps S1, S2, . . . , while describing an operation of the measurement apparatus A1.

In FIGS. 1 and 2, a semiconductor sample 1 to be measured is sealed into the solution cell 4 in advance, together with the solution 3 which is obtained by dissolving iodine with ethanol. As a result, a surface of the semiconductor sample 1 is passivated as in the conventional method (S1). The semiconductor sample 1 which is now in a passivated state is moved to a lifetime measurement position by a stage 2. The lifetime measurement position is a position at which the microwave energy from the microwave generator 5, the laser light (excitation light) from the laser light source 9 and the white light (bias light) from the halogen light source 13 are all irradiated. After positioning the semiconductor sample 1 at the lifetime measurement position, the microwaves, the excitation light and the bias light are irradiated upon a surface of the semiconductor sample 1 at the following timing.

Figure 3A:
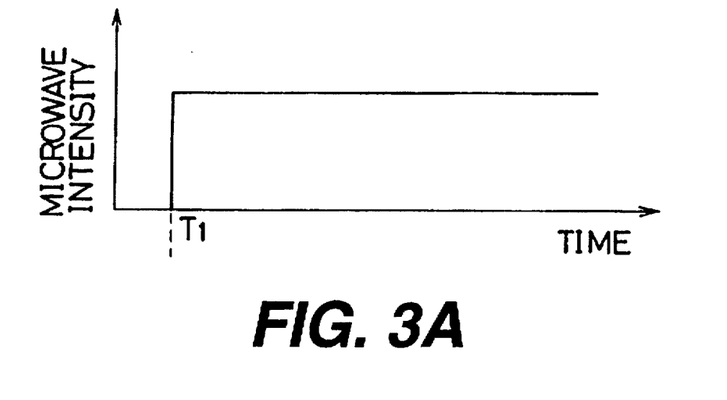
FIG. 3 is a diagram showing the timing of reflecting or transmitting microwave, excitation light and bias light upon a surface of a semiconductor sample.
Figure 3B:
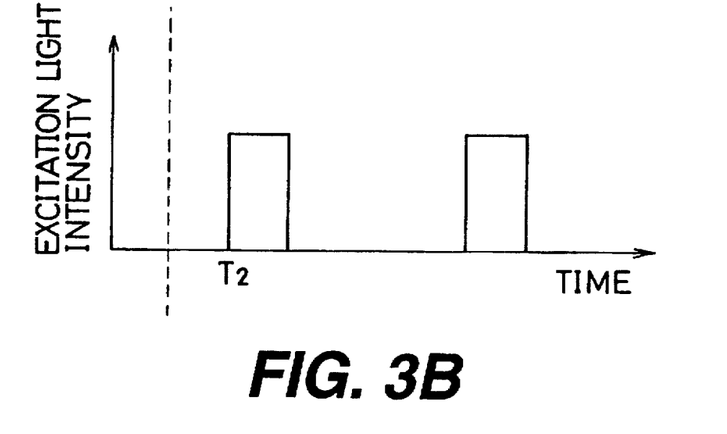
Figure 3C:
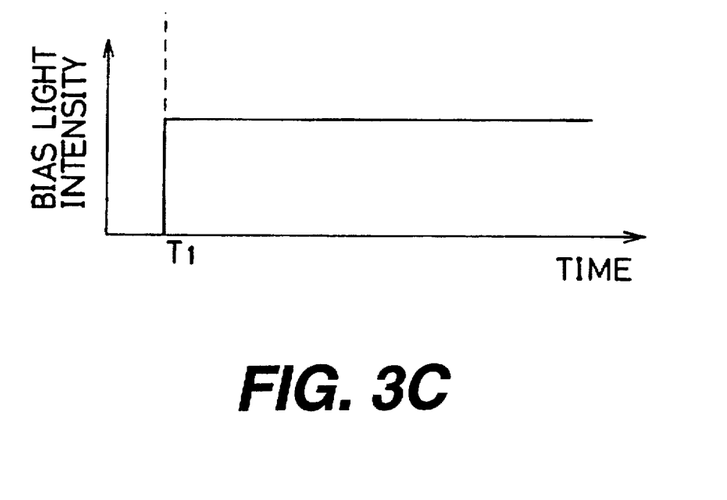

FIG. 3 shows the timing of reflecting or transmitting the microwaves, the excitation light and the bias light upon the surface of the semiconductor sample. As shown in FIG. 3, at a time T1, the microwave generator 5 such as a Gunn diode operates and generates microwaves. The microwaves pass through the waveguide 6 and the circulator 7, and through the antenna 8 for irradiating and detecting microwaves, is irradiated upon the passivated surface of the semiconductor sample 1 (S2). At the same time, the halogen light source 13 operates and generates bias light. The bias light is irradiated directly upon the passivated semiconductor sample 1 (S3'). While the microwave generator 5 and the halogen light source 13 start operating at the same time in this preferred embodiment, the microwave generator 5 and the halogen light source 13 may start operating at different times.

At a time T2 after a certain period of time from the time T1, the laser light source 9 operates and generates pulsed laser light. The laser light is irradiated as excitation light upon the surface of the semiconductor sample 1 which is successively irradiated with the microwaves and the bias light (S3). When excitation light is irradiated in this manner, carriers are created in the semiconductor sample 1.

Reflected microwaves from the semiconductor sample 1 passes through the antenna 8 and the circulator 7 once again, and is detected by the microwave detector 10 (S4). The computing element 11 calculates a change with time in the intensity of the reflected microwaves which is detected in this manner. The lifetime is calculated from a result of the computation and displayed in the displaying element 12 (S5).

Figure 4:
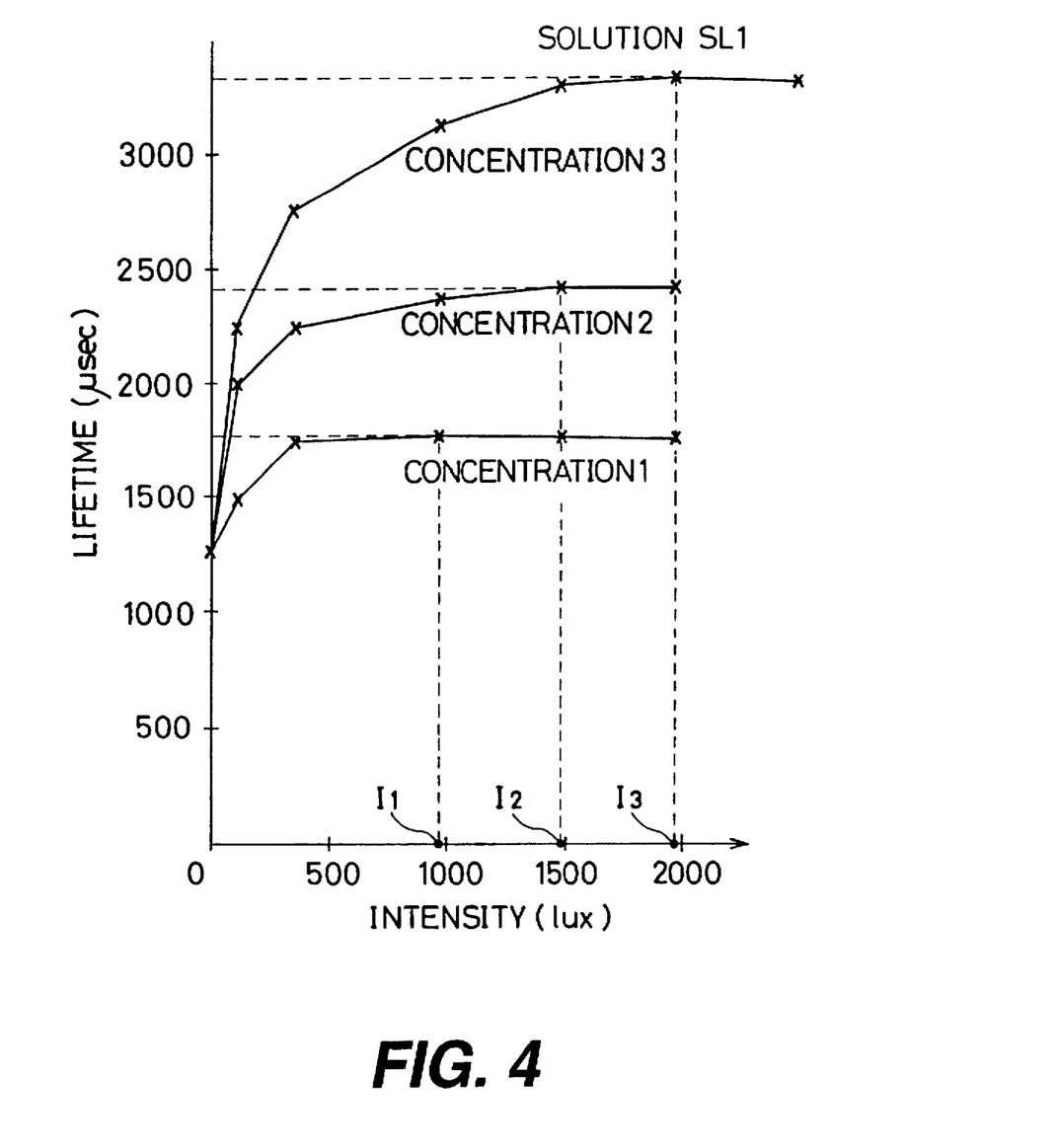
FIG. 4 is a graph showing a change in the lifetime due to irradiation of bias light.

FIG. 4 shows an example of a measurement result which is obtained in this manner. In this example, bias light having different illumination intensities are irradiated upon the semiconductor sample 1 which is passivated using a certain solution SL1 and lifetime associated with each bias light is measured. The measurement result shows that irradiation of bias light largely increases lifetime. This is because irradiation of bias light increases the quantity of ionic substances in the solution 3. This will be described in more detail with reference to FIGS. 5 and 6.

Figure 5:
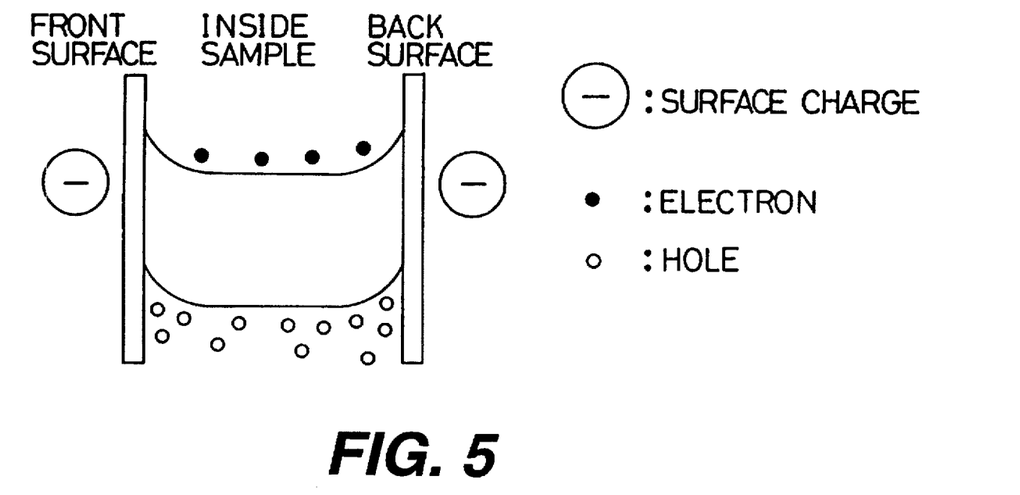
FIG. 5 is a schematic diagram of a band structure of a semiconductor sample as it is before irradiated with bias light.
Figure 6:
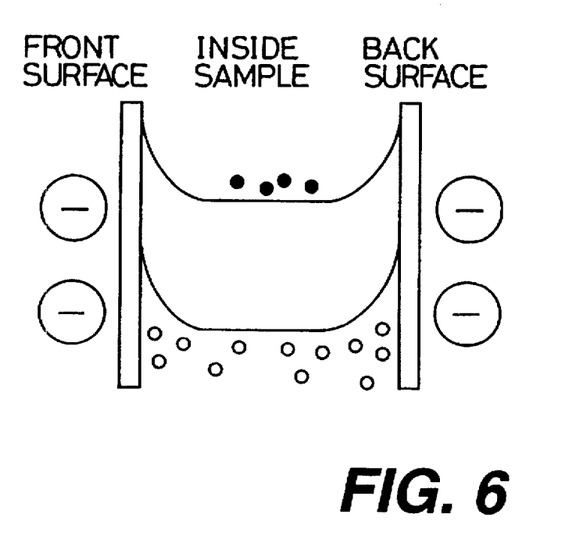
FIG. 6 is a schematic diagram of the band structure of the semiconductor sample as it is being irradiated with bias light.

FIG. 5 is a schematic diagram of a band structure of a semiconductor sample as it is before irradiated with bias light, while FIG. 6 is a schematic diagram of the band structure of the semiconductor sample as it is being irradiated with bias light. As can be understood clearly by comparing FIG. 5 with FIG. 6, irradiation of the bias light increases the quantity of ionic substances in the solution 3, minority carriers (electrons indicated as black circles in FIGS. 5 and 6) are pushed deeper into the sample by electric charges at the surface regions, and the number of minority carriers which recombine at the surface regions of the sample decreases. In other words, irradiation of the bias light suppresses surface recombination. This makes it possible to measure the lifetime τb within the semiconductor sample which is to be originally measured.

Referring to FIG. 4 once again, while such an effect as above is created when the intensity of the bias light is increased and the lifetime is accordingly extended, if bias light whose intensity is equal to or greater than a certain level is irradiated, the lifetime is saturated. Hence, by irradiating the semiconductor sample 1 with bias light whose intensity is equal to or larger than a saturating intensity level, it is possible to almost perfectly suppress surface recombination and hence to more accurately measure the lifetime. The saturating light intensity level changes depending on the concentration of the solution 3. Further, according to similar measurement using different types of the solution 3, it is found that the saturating light intensity level varies among different types of the solution 3. That is, it is possible to optionally set the saturating light intensity level by appropriately combining the type of a solution and the concentration of the solution.

Considering this, a table is prepared in advance which shows light intensities which saturate the lifetime depending on the combination of the type and the concentration of a solution to be used. For instance, a table as that described below is prepared when the solution SL1 above is to be used, and bias light whose intensity is equal to or larger than such an intensity level which corresponds to the concentration of the solution is irradiated upon the semiconductor sample 1, so that there is almost no surface recombination. As a result, it is possible to accurately calculate the lifetime τb which is to be originally measured of carriers which exist within the semiconductor sample.

TABLE

| Combination of Type and Concentration of Solution | Light Intensity Needed to Saturate Lifetime |
|---|---|
| Solution SL1/Concentration 1 | I1 |
| Solution SL1/Concentration 2 | I2 |
| Solution SL1/Concentration 3 | I3 |

Figure 7:
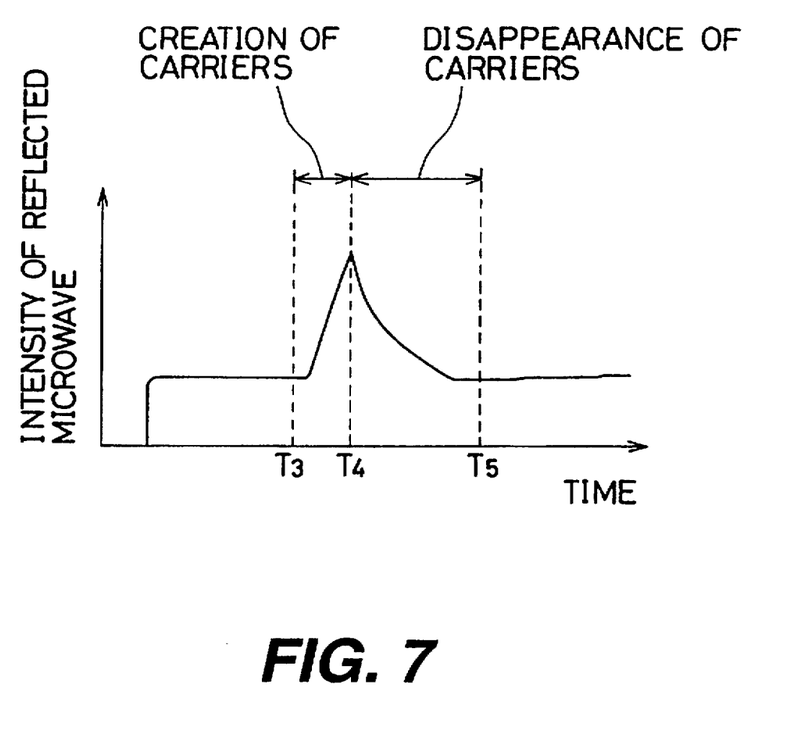
FIG. 7 is a graph showing a change in the intensity of microwave from a sample due to creation and disappearance of carriers.

Further, although the bias light is constantly irradiated upon the semiconductor sample 1 in the preferred embodiment described above as shown in FIG. 3, pulse-like bias light may be irradiated. In such a case, it is necessary to irradiate the bias light at least since before carriers are created in the semiconductor sample due to excitation light until the carriers disappear. The reason will be described in the following with reference to FIG. 7. Irradiation of the excitation light creates carriers in the semiconductor sample, from a time T3. Creation of the carriers completes at a time T4, and the carriers start disappearing. The carriers disappear one by one and all carriers completely disappear at a time T5. Hence, it is not possible to suppress surface recombination and therefore the effect above cannot be ensured if the bias light is not irradiated from the time T3 until the time T5.

Figure 8:
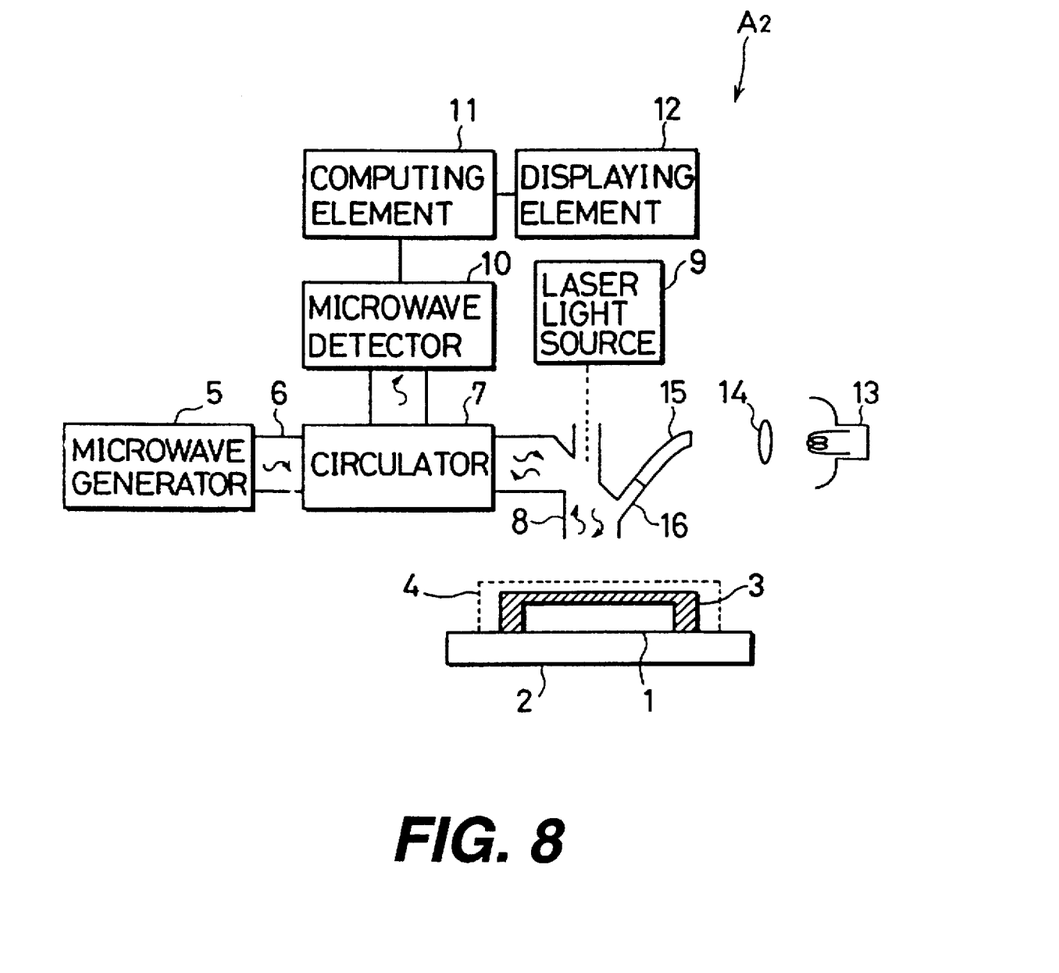
FIG. 8 is a diagram showing a measurement apparatus according to a further preferred embodiment, to which the measurement method shown in FIG. 1 is applicable.

The method as above can be realized in a measurement apparatus A2 as well which is shown in FIG. 8.

In FIG. 8, the semiconductor sample 1 to be measured is moved to the lifetime measurement position by the stage 2. Operation of the laser light source 9 creates carriers within the semiconductor sample 1 which is placed at the measurement position. The antenna 8 irradiates microwaves upon the semiconductor sample 1, and detects the reflected microwaves from the semiconductor sample 1 to measure the lifetime. This structure is similar to the measurement apparatus A1 described earlier. A large difference of the measurement apparatus A2 from the measurement apparatus A1 is that the bias light irradiating means is formed by the halogen 13 and waveguide means. The waveguide means is formed by a lens 14 which converges bias light from the halogen light source 13 and an optical fiber 15 which guides the bias light which is converged by the lens 14 toward a surface of the semiconductor sample 1. The waveguide means ensures that the bias light from the halogen light source 13 impinges upon one end of the optical fiber 15 through the lens 14 and further upon a light introduction hole 16 which is connected to the antenna 8 through the other end of the optical fiber 15. Since the bias light is irradiated upon the surface of the sample together with the microwaves and the excitation light, it is possible to irradiate the bias light upon the surface of the sample more steadily and efficiently and hence to efficiently suppress surface recombination.

Figure 9:
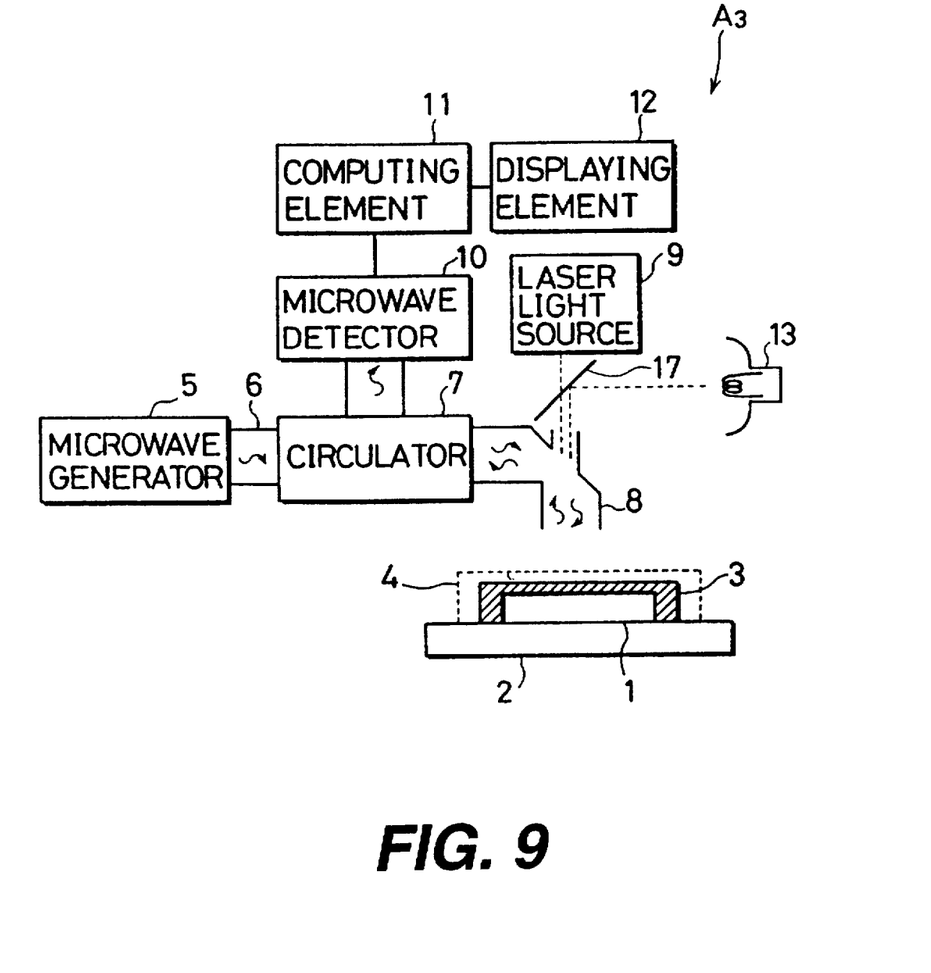
FIG. 9 is a diagram showing a measurement apparatus according to other preferred embodiment, to which the measurement method shown in FIG. 1 is applicable.

The method as above can be realized in a measurement apparatus A3 as well which is shown in FIG. 9.

The measurement apparatus A3 is different from the apparatus A2 of FIG. 8 in that the light-guide means is formed by a half mirror 17 which is disposed on an optical path of the excitation light (i.e., laser light). In the measurement apparatus A3, the bias light from the halogen light source 13 is reflected by the half mirror 17 and guided onto the surface of the semiconductor sample 1 after tracing the same optical path as the excitation light. Hence, as in the measurement apparatus A2, the bias light is irradiated upon the surface of the sample together with the microwaves and the excitation light, and therefore, it is possible to irradiate the bias light upon the surface of the sample more steadily and efficiently and hence to efficiently suppress surface recombination.

Figure 10:
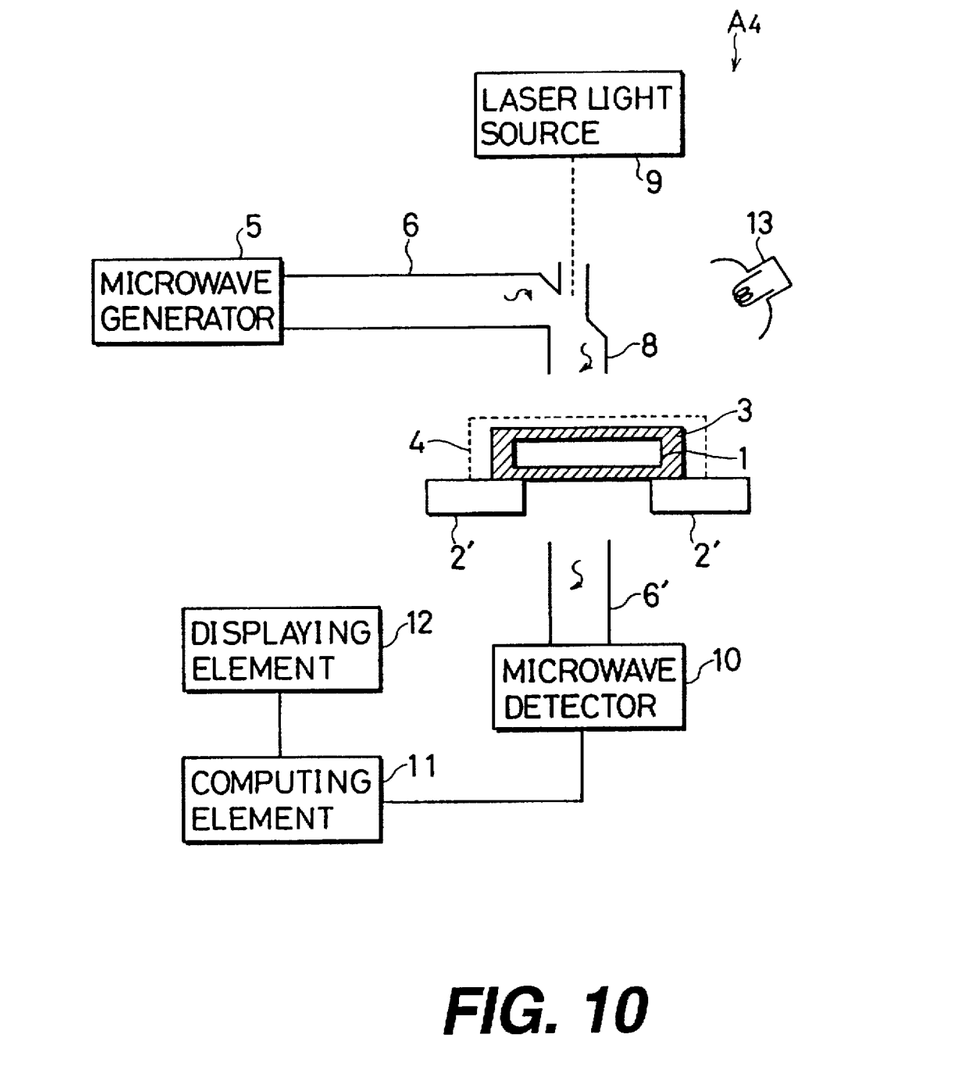
FIG. 10 is a diagram showing a measurement apparatus according to still other preferred embodiment, to which the measurement method shown in FIG. 1 is applicable.

The method as above can be realized in a measurement apparatus A4 as well which is shown in FIG. 10.

The measurement apparatus A4 is different from the measurement apparatus A1 (FIG. 2) in that the measurement apparatus A4 detects transmitted microwaves to measure the lifetime of carriers which exist within the semiconductor sample 1 while the measurement apparatus A1 detects reflected microwaves for the same purpose. The measurement apparatus A4 is otherwise the same as the measurement apparatus A1, in terms of basic structure, principles of measurement, etc. In the measurement apparatus A4 as well, it is possible to effectively suppress surface recombination within the semiconductor sample 1 and hence to accurately measure the lifetime of the carriers which exist within the semiconductor sample, as in the measurement apparatus A1.

As described above, since the semiconductor sample 1 is measured while immersed in the solution 3 which contains an electrolyte in the preferred embodiments above, ionic substances in the solution 3 changes a surface potential of the semiconductor sample 1 so that surface recombination is suppressed. Further, since excitation light (i.e., laser light) is irradiated upon the semiconductor sample 1 to measure the lifetime while irradiating bias light separately from the excitation light upon the semiconductor sample 1 at the same time, the quantity of the ionic substances in the solution 3 further increases. This further changes the surface potential of the semiconductor sample 1 and hence the effect of suppressing surface recombination. In addition, since light having an optimal intensity is irradiated depending on the type and the concentration of the solution 3 in the preferred embodiments above, it is possible to almost completely suppress surface recombination.

As a result, the lifetime which is measured is under almost no influence of the lifetime of carriers which exist at the surface of the sample, and therefore, the lifetime which is measured in this manner indicates the lifetime which is to be originally measured of carriers which exist within the sample. Thus, it is possible to measure the lifetime of the carriers which exist within the semiconductor sample at a high accuracy, without being influenced by surface recombination.

While the semiconductor sample 1 is sealed into the solution cell 4, together with the solution 3 which is obtained by solving iodine with ethanol in the apparatuses A1 to A4 according to the preferred embodiments above, the lifetime may be measured with the solution coating the surface of the sample. In such a case as well, it is possible to suppress surface recombination and measure the lifetime with a high degree of accuracy.

While the invention has been described in detail, the foregoing description is in all aspects illustrative and not restrictive. It is understood that numerous other modifications and variations can be devised without departing from the scope of the invention.

What is claimed is:

1. A method of measuring the lifetime of carriers which exist within a semiconductor sample, comprising the steps of:

passivating a surface of a semiconductor sample, using a solution which contains an electrolyte;

selectively irradiating excitation light upon the passivated surface of said semiconductor sample while irradiating microwaves upon the passivated surface of said semiconductor sample;

irradiating bias light upon the passivated surface of said semiconductor sample starting at least before carriers are created in said semiconductor sample as a result of said excitation light and until said carriers disappear; and detecting microwaves reflected or transmitted from said semiconductor sample to measure the lifetime of carriers that are induced within said semiconductor sample, based on a change in said reflected or transmitted microwaves.

2. A method as defined in claim 1, wherein the intensity of said bias light is equal to or greater than a saturation intensity determined by a type and concentration of said solution.

3. A method as defined in claim 1, wherein said bias light is constantly irradiated upon the surface of said semiconductor sample.

4. A method as defined in claim 1, wherein said semiconductor sample is immersed into said solution which contains said electrolyte so that the surface of said semiconductor sample is passivated.

5. A method as defined in claim 1, wherein said solution is obtained by dissolving iodine with ethanol.

6. An apparatus for measuring the lifetime of carriers which exist within a semiconductor sample, comprising:

sample surface processing means for passivating a surface of a semiconductor sample with a solution that contains an electrolyte;

microwave irradiating means for irradiating microwaves upon the passivated surface of said semiconductor sample;

excitation light irradiating means for selectively irradiating excitation light upon the passivated surface of said semiconductor sample that is irradiated with said microwaves;

bias light irradiating means for irradiating bias light upon the passivated surface of said semiconductor sample starting at least before carriers are created in said semiconductor sample as a result of said excitation light and until said carriers disappear; and lifetime measuring means for detecting microwaves reflected or transmitted from said semiconductor sample and for measuring the lifetime of carriers that are induced within said semiconductor sample, based on a change in said reflected or transmitted microwaves.

7. An apparatus as defined in claim 6, wherein said bias light irradiating means includes a light source which emits bias light whose intensity is equal to or greater than a saturation intensity determined by a type and concentration of said solution.

8. An apparatus as defined in claim 7, wherein said light source is a halogen lamp.

9. An apparatus as defined in claim 7, wherein said bias light irradiating means further comprises light-guide means which guides said bias light emitted from said light source onto the surface of said semiconductor sample.

10. An apparatus as defined in claim 9, wherein said light-guide means includes:

a lens for converging said bias light from said light source; and an optical fiber for guiding said bias light which is converged by said lens toward the surface of said semiconductor sample.

11. An apparatus as defined in claim 9, wherein said light-guide means includes a half mirror which is disposed on an optical path of said excitation light to coincide the optical path of said bias light from said light source to the optical path of said excitation light.

12. An apparatus as defined in claim 6, wherein said sample surface processing means includes an immersion bath for immersing said semiconductor sample into said solution which contains said electrolyte.

13. A method as defined in claim 1, wherein said step of selectively irradiating said excitation light includes irradiating the passivated surface of said semiconductor sample with said excitation light while irradiating the passivated surface of said semiconductor sample with said microwaves and said bias light.

14. An apparatus as defined in claim 6, wherein said excitation light radiating means, said bias light radiating means, and said microwave generating means are operatively connected whereby the passivated surface of said semiconductor sample is selectively irradiated with said excitation light while being irradiated with said microwaves and said bias light.

* * * * *